(12) United States Patent
Kwon et al.

(10) Patent No.: US 10,878,998 B2
(45) Date of Patent: Dec. 29, 2020

(54) MAGNETIC MATERIAL AND PREPARATION METHOD THEREOF

(71) Applicant: LG Chem, Ltd., Seoul (KR)

(72) Inventors: Soon Jae Kwon, Daejeon (KR); Juneho In, Daejeon (KR); Byungkyu Lim, Daejeon (KR); Pumsuk Park, Daejeon (KR)

(73) Assignee: LG Chem, Ltd.

( * ) Notice: Subject to any disclaimer, the term of this patent is extended or adjusted under 35 U.S.C. 154(b) by 366 days.

(21) Appl. No.: 15/766,065

(22) PCT Filed: Dec. 16, 2016

(86) PCT No.: PCT/KR2016/014818
§ 371 (c)(1),
(2) Date: Apr. 5, 2018

(87) PCT Pub. No.: WO2017/105136
PCT Pub. Date: Jun. 22, 2017

(65) Prior Publication Data
US 2018/0286543 A1    Oct. 4, 2018

(30) Foreign Application Priority Data
Dec. 18, 2015    (KR) .................. 10-2015-0181699

(51) Int. Cl.
*H01F 41/02*    (2006.01)
*C01B 35/04*    (2006.01)
*H05K 9/00*    (2006.01)

(52) U.S. Cl.
CPC ......... *H01F 41/0246* (2013.01); *C01B 35/04* (2013.01); *H05K 9/0075* (2013.01);
(Continued)

(58) Field of Classification Search
CPC ... C01B 35/05; H01F 1/34; H01F 1/36; H01F 1/0311; H01F 1/10; H01F 1/11; C01P 2002/54; C01P 2004/61; C01P 2006/42
See application file for complete search history.

(56) References Cited

U.S. PATENT DOCUMENTS 3,424,687 A * 1/1969 Hirota .................. H01F 1/0311
252/62.51 R
5,478,418 A * 12/1995 Miura ...................... F01L 1/14
148/438
(Continued)

FOREIGN PATENT DOCUMENTS

CN    101973559    * 12/2011
CN    101973559 B    12/2011
(Continued)

OTHER PUBLICATIONS

Search report from International Application No. PCT/KR2016/014818, dated Mar. 20, 2017.
(Continued)

*Primary Examiner* — C Melissa Koslow
(74) *Attorney, Agent, or Firm* — Lerner, David, Littenberg, Krumholz & Mentlik, LLP (57) ABSTRACT

A method of preparing a MnB-based magnetic material, the method including the steps of preparing a mixture including manganese oxide and boron, and heat-treating the mixture under an inert atmosphere, a MnB-based magnetic material prepared thereby, and a material absorbing or shielding electromagnetic waves, or a semiconductor, electronic, communication, or display device including the MnB-based magnetic material, are provided.

18 Claims, 6 Drawing Sheets

(52) U.S. Cl.
CPC ...... *C01P 2002/54* (2013.01); *C01P 2002/72* (2013.01); *C01P 2004/03* (2013.01); *C01P 2004/61* (2013.01); *C01P 2006/42* (2013.01)

(56) References Cited

U.S. PATENT DOCUMENTS

| | | |
|---|---|---|
| 2015/0123605 A1 | 5/2015 | Hyun et al. |
| 2015/0348684 A1 | 12/2015 | Sugimoto et al. |

FOREIGN PATENT DOCUMENTS

| | | |
|---|---|---|
| EP | 2423164 A1 | 2/2012 |
| JP | H05029125 A | 2/1993 |
| JP | 2001217109 A | 8/2001 |
| JP | 2004099367 A | 4/2004 |
| KR | 20130122452 A | 11/2013 |
| KR | 20140131071 A | 11/2014 |
| KR | 20150090242 A | 8/2015 |

OTHER PUBLICATIONS

Zhu, Hao, et al., "Fabrication and magnetic property of MnB alloy." Journal of Applied Physics, vol. 97, 10M512, Presented on Nov. 11, 2004; published online May 16, 2005, pp. 1-3.

Traore, K., and J. P. Kappler. "Variation of the Crystalline Parameters of Solid Solutions of Manganese, Cobalt, Nickel, and Iron Borides as a Function of Their Composition." Chemischer Informationsdienst vol. 11, No. 11 (1980): Abstract 005. First published Mar. 18, 1980.

Search Report from Second Chinese Office Action for Application No. 201680060931.8 dated May 11, 2020; 2 pages.

* cited by examiner

MAGNETIC MATERIAL AND PREPARATION METHOD THEREOF

CROSS-REFERENCE TO RELATED APPLICATIONS

This application is a national phase entry under 35 U.S.C. § 371 of International Application No. PCT/KR2016/014818, filed Dec. 16, 2016, which claims priority to Korean Patent Application No. 10-2015-0181699, filed Dec. 18, 2015, the disclosures of which are incorporated herein by reference.

TECHNICAL FIELD

The present application relates to a magnetic material and a preparation method thereof. More particularly, the present application relates to a MnB-based magnetic material and a preparation method thereof. Further, the present application relates to a material and a device absorbing or shielding electromagnetic waves, including the MnB-based magnetic material.

BACKGROUND OF THE INVENTION

Generally, magnetic materials including Mn and B are produced through high-temperature melting of Mn metal and B metal by using arc melting equipment or induction melting equipment, or through heat treatment for a long time after high-pressure compression of the Mn metal powder and the B metal powder.

However, the general methods as described above require special equipment for arc melting or induction melting, and it is difficult to control a particle size or shape of the MnB-based magnetic material. In addition, there is a limitation in controlling physical properties for absorption or shielding of electromagnetic waves by inducing hysteresis loss.

DETAILS OF THE INVENTION

Objects of the Invention

The present application provides a method of preparing a MnB-based magnetic material, a MnB-based magnetic material prepared thereby, and a material and a device absorbing or shielding electromagnetic waves, including the MnB-based magnetic material.

Means for Achieving the Object

An aspect of the present application provides a method of preparing a MnB-based magnetic material, the method including the steps of preparing a mixture including manganese oxide and boron, and heat-treating the mixture under an inert atmosphere.

According to an embodiment of the present application, the mixture further includes calcium oxide.

According to another embodiment of the present application, the mixture further includes a transition metal or lanthanide metal oxide.

Another aspect of the present application provides a MnB-based magnetic material prepared by the above-described preparation method.

According to an embodiment of the present application, the MnB-based magnetic material is represented by the following Chemical Formula 1 or 2:

$$Mn_aB_b \quad \text{Chemical Formula 1}$$

wherein a and b are real numbers representing an atomic ratio of Mn and B, and
a:b is 1:0.5-1:1.5;

$$Mn_cM_dB_e \quad \text{Chemical Formula 2}$$

wherein M is a transition metal or lanthanide metal, for example, a 3d transition metal such as chromium (Cr), iron (Fe), cobalt (Co), nickel (Ni), etc., a 4d transition metal such as niobium (Nb), molybdenum (Mo), etc., a lanthanide metal such as cerium (Ce), praseodymium (Pr), neodymium (Nd), samarium (Sm), europium (Eu), gadolinium (Gd), terbium (Tb), dysprosium (Dy), erbium (Er), ytterbium (Yb), etc.,
c, d, and e are real numbers representing an atomic ratio of Mn, M, and B,
d/(c+d) is 0.05 to 0.2, and
(c+d):e=1:0.8-1:1.2.

Still another aspect of the present application provides a material absorbing or shielding electromagnetic waves, including the MnB-based magnetic material prepared by the above-described preparation method.

Still another aspect of the present application provides a semiconductor, electronic, communication, or display device including the material absorbing or shielding electromagnetic waves.

Effects of the Invention

According to embodiments of the present application, a MnB-based magnetic material may be prepared by a single-step solid chemical reaction without using a general method of high-temperature melting or heat treatment for a long time after high-pressure compression, and therefore, the MnB-based magnetic material may be efficiently and economically obtained by saving energy and shortening a preparation time. According to embodiments of the present application, it is also possible to prepare the MnB-based magnetic material whose particle size is controlled at a micrometer level, and to prepare a large amount of the MnB-based magnetic material, as compared with the general methods.

BEST MODE FOR CARRYING OUT THE INVENTION

An aspect of the present application relates to a method of preparing a MnB-based magnetic material, the method including the steps of preparing a mixture including manganese oxide and boron, and heat-treating the mixture under an inert atmosphere.

According to the aspect, during preparation of the MnB-based magnetic material, manganese oxide and boron are used as starting materials, and are heat-treated under an inert atmosphere, thereby preparing the MnB-based magnetic material by a solid chemical reaction. Accordingly, it is possible to easily control process conditions and to efficiently prepare a large amount of the MnB-based magnetic material, as compared with the general method of high-temperature melting or heat treatment for a long time after high-pressure compression. In addition, according to the aspect, it is easy to control a size and shape of the MnB-based magnetic material, and therefore it is possible to prepare the MnB-based material whose particle size is controlled at a micrometer level.

According to an embodiment, MnO, $Mn_3O_4$, $Mn_2O_3$, $MnO_2$, $MnO_3$, etc. may be used as the manganese oxide, and MnO is preferred in terms of reaction efficiency. As the manganese oxide, particle-shaped manganese oxide may be used. In this regard, a particle diameter thereof may be in a size of several micrometers to several hundred micrometers. For example, MnO particles having a particle diameter of 5 micrometers to 500 micrometers, specifically, 30 micrometers to 300 micrometers, may be used. The manganese oxide exemplified above may be purchased from commercially available sources, for example, Sigma-Aldrich or Alfa.

According to an embodiment, the amorphous boron particles may be used as the boron. As the boron particles, particles ranging in the size from under a micrometer to several micrometers may be used. According to an embodiment, boron particles having a particle diameter of 5 μm to 500 μm, specifically, 30 μm to 300 μm, may be used. The boron particle may be purchased from commercially available sources, for example, Sigma-Aldrich.

According to an embodiment, the mixture including manganese oxide and boron includes manganese oxide and boron in an amount such that an atomic ratio of boron to manganese is 1 or more, preferably 5/3 or more, for example, 5/3 to 2, and more preferably 5/3 or more, and less than 2. Within the atomic ratio, boron may serve as a reactant and a reducing agent at the same time.

Further, when a substance acting as a reducing agent is not sufficient, there is a problem that it is difficult to prepare the MnB magnetic powder of the present invention, or the MnB magnetic powder is prepared together with Mn rich boride.

The step of preparing the mixture including manganese oxide and boron may be performed by a method of mixing manganese oxide and boron. As the mixing method, a method that is well-known in the art may be used, and for example, manganese oxide and boron particles may be mixed with a mortar for 15 minutes or more or by milling overnight with appropriate zirconia balls at 200 rpm.

According to another embodiment of the present application, the mixture further includes calcium oxide in addition to manganese oxide and boron. Calcium oxide may play a role in controlling the particle size and aggregation of the MnB-based magnetic material. Further, due to diffusion of part of manganese (Mn) to boron oxide which is a reaction by-product, a slight deficiency of Mn may occur during formation of the MnB-based magnetic material, but the presence of calcium oxide may prevent this problem. Further, calcium oxide may help to easily remove the reaction by-product with NaOH and/or acetic acid. The calcium oxide may be used in an amount such that an equivalent ratio of manganese oxide and calcium oxide in the mixture is in the range of 1:0.1 to 1:2. As the calcium oxide, particle-shaped calcium oxide may be used, and for example, fine particle powder may be used. The calcium oxide may be purchased from commercially available sources. A particle size of the calcium oxide particle may be approximately several micrometers or less.

According to still another embodiment, the mixture may further include a transition metal oxide or lanthanide oxide. The transition metal oxide or lanthanide oxide may be, for example, an oxide including at least one of a 3d transition metal such as chromium (Cr), iron (Fe), cobalt (Co), nickel (Ni), etc., a 4d transition metal such as niobium (Nb), molybdenum (Mo), etc., and a lanthanide metal such as cerium (Ce), praseodymium (Pr), neodymium (Nd), samarium (Sm), europium (Eu), gadolinium (Gd), terbium (Tb), dysprosium (Dy), erbium (Er), ytterbium (Yb), etc. The transition metal oxide or lanthanide oxide may function to provide a metal which is doped into the MnB-based magnetic material. The transition metal oxide or lanthanide oxide may be used in an amount such that an atomic ratio of manganese to the transition metal or lanthanide metal in the mixture is 4:1 to 19:1, for example, 8:1 to 9:1.

For example, as the transition metal oxide, chromium (Cr) oxide, iron (Fe) oxide, cobalt (Co) oxide, nickel (Ni) oxide, niobium (Nb) oxide, or molybdenum (Mo) oxide may be used.

For example, as the lanthanide metal oxide, $Ce_2O_3$, $Pr_2O_3$, $Nd_2O_3$, $Sm_2O_3$, $Eu_2O_3$, $Gd_2O_3$, $Tb_2O_3$, $Dy_2O_3$, $Er_2O_3$, $Yb_2O_3$, etc. may be used.

As the transition metal oxide or lanthanide metal oxide, a transition metal oxide or lanthanide metal oxide in a particle state may be used, and for example, may be purchased from commercially available sources, for example, Sigma-Aldrich. For example, as the transition metal oxide or lanthanide metal oxide, particles having a particle size of 100 nm to several micrometers may be used.

According to an embodiment of the present application, a step of compressing the mixture after mixing the mixture well may be performed. A degree of compression may be determined as needed, and for example, compression may be performed under conditions of room temperature and 2000 atm or more. By the compression, the mixture may be molded into a particular shape, for example, a cylindrical shape. When the mixture is compressed as above, a combustion synthesis method among solid state synthesis methods is favorable. Specifically, the mixture compressed as above is heated at an appropriate temperature to induce combustion of manganese oxide which is a reactant and boron which acts as a reducing agent. In this regard, since heat generated during the reaction is sufficient to allow a series of reactions between manganese oxide which is a reactant and boron which acts as a reducing agent, a high quality product may be obtained in a short time while reducing energy consumption.

Subsequently, the step of heat-treating the mixture prepared according to the above-described embodiments under an inert atmosphere is performed.

The heat treatment is performed under a temperature condition which is required for the solid chemical reaction of manganese oxide and boron. A spontaneous exothermic reaction may occur by performing heat-treatment of the above-described mixture including manganese oxide and boron under an inert atmosphere. For example, the heat treatment may be performed in the range of 750° C. to 1000° C.

The heat treatment may be performed until oxidation/reduction occurs under the spontaneous exothermic reaction of manganese oxide and boron to produce the MnB-based magnetic material. That is, manganese oxide is reduced to a manganese metal and boron is oxidized to boron oxide ($B_2O_3$), and boron which does not participate in the oxidation reaction acts as a reactant to form MnB. A heat treatment time may differ depending on the amounts of the starting materials and reaction conditions, but the heat treatment may be performed, for example, for 3 minutes to 120 minutes. The heat treatment may be performed under an inert atmosphere. The inert atmosphere may be formed by using an inert gas which is known in the chemical processing field, and the heat treatment may be performed under a gas atmosphere of, for example, Ar, He, etc. For example, the heat treatment may be performed under an Ar atmosphere at a level of 5 N. Preferably, a water content is below a ppm level. As described above, when the heat treatment is performed under an inert atmosphere, the yield and purity of the product may be increased.

According to still another embodiment of the present application, a step of cooling the reaction product at room temperature may be further included, after the heat treatment. This step is to facilitate the subsequent collection or post-treatment of the reaction product.

According to still another embodiment of the present application, a step of pulverizing the reaction product may be further included, after the heat treatment. When this pulverization step is carried out, it is advantageous for separation of by-products described below.

According to still another embodiment of the present application, a step of eliminating by-products may be further included, after the heat treatment. After the cooling or pulverizing step is performed, the reaction by-products may be eliminated. The reaction by-products may vary depending on the kinds of the reactants. For example, when reaction is performed by using the mixture including manganese oxide and boron, $B_2O_3$ may be generated as the reaction by-product, and when calcium oxide is added to the mixture, $Ca_3(BO_3)_2$ may be generated as the reaction by-product. The reaction by-products may exist in a molten state during the reaction process.

Elimination of the reaction by-products may be performed by using a solution in which the reaction by-products may be dissolved. As the solution for eliminating the reaction by-products, a basic aqueous solution containing a solute which functions as a bleach or a solution containing an organic acid such as acetic acid may be used. For example, an aqueous solution containing NaOCl and KOH, a NaOH aqueous solution, an acetic acid aqueous solution, etc. may be used.

According to still another embodiment of the present application, a step of washing the MnB-based magnetic material may be further performed, after eliminating the reaction by-products. The washing may be performed by using a solvent such as distilled water or acetone. Depending on the kind of the solvent used in the washing step, a drying step may be further included.

Figure 1:
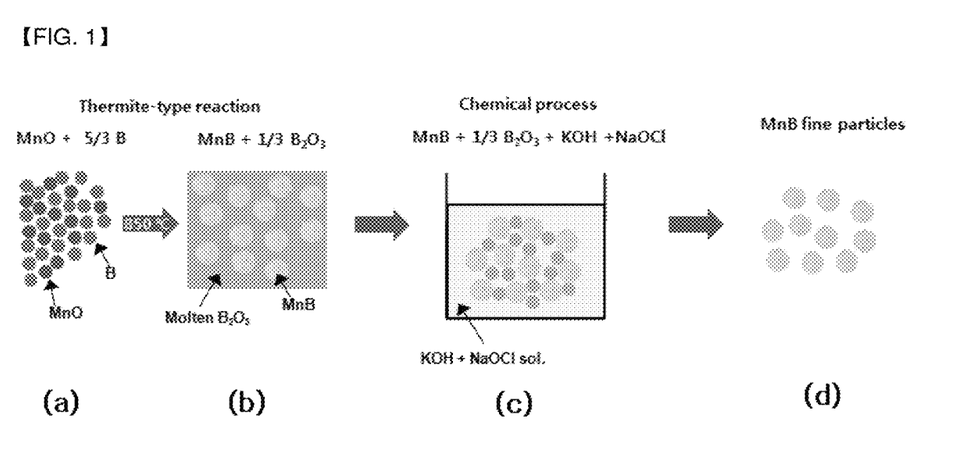
FIG. 1 shows a schematic illustration of a sequence of a process according to an embodiment of the present application.

FIG. 1 shows a schematic illustration of a method of preparing the MnB-based magnetic material of the present application according to Example 1 described below. In FIG. 1, (a) shows starting materials, and (b) shows a state in which a reaction by-product and a product (MnB-based magnetic material) are mixed after heat treatment. (c) shows the step of eliminating the reaction by-product by using KOH and NaOCl, and (d) shows a state in which MnB-based magnetic particles are finally obtained.

Another aspect of the present application provides the MnB-based magnetic material prepared by the above-described preparation method. The MnB-based magnetic material may be used as a material for shielding electromagnetic waves, which controls coercivity (Hc) inducing absorption or shielding of electromagnetic waves by inducing hysteresis loss, and has both properties of hysteresis loss and ohmic loss by inducing ohmic loss. Specifically, MnB has a specific resistivity value of 0.31569 mΩcm, which is comparable with ferrite ($10^7$ mΩcm), an FEI alloy 50 (49 mΩcm), Finemet (FT-3M) (0.12 mΩcm), and silver (1.59× $10^{-7}$ mΩcm).

In the general method, the material is synthesized by melting a chip lump at a high temperature, whereas according to the above-described embodiments of the present application, the particle size may be uniformly controlled in the range of several micrometers, for example, 1 μm to 10 μm. According to embodiments of the present application, the MnB-based magnetic material may be a spherical particle.

According to still another embodiment of the present application, the MnB-based magnetic material is represented by the following Chemical Formula 1 or 2.

$$Mn_aB_b \qquad \text{Chemical Formula 1}$$

Herein, a and b are real numbers representing an atomic ratio of Mn and B, and a:b is 1:0.5-1:1.5.

According to an embodiment, a:b in Chemical Formula 1 is 1:0.8-1:1.2.

$$Mn_cM_dB_e \qquad \text{Chemical Formula 2}$$

Herein, M is a transition metal or lanthanide metal, for example, a 3d transition metal such as chromium (Cr), iron (Fe), cobalt (Co), nickel (Ni), etc., a 4d transition metal such as niobium (Nb), molybdenum (Mo), etc., a lanthanide metal such as cerium (Ce), praseodymium (Pr), neodymium (Nd), samarium (Sm), europium (Eu), gadolinium (Gd), terbium (Tb), dysprosium (Dy), erbium (Er), ytterbium (Yb), etc., c, d, and e are real numbers representing an atomic ratio of Mn, M, and B, d/(c+d) is 0.05 to 0.2, and (c+d):e=1:0.8-1:1.2.

According to an embodiment, M of Chemical Formula 1 is chromium (Cr), iron (Fe), cobalt (Co), nickel (Ni), or neodymium (Nd).

According to an embodiment, M of Chemical Formula 1 is neodymium (Nd).

According to another embodiment of the present application, the MnB-based material may be in the form of a composite with a polymer such as an epoxy resin or a rubber.

Still another aspect of the present application may provide a material absorbing or shielding electromagnetic waves, including the MnB-based magnetic material prepared by the above-described preparation method.

The material absorbing or shielding electromagnetic waves may have a structure that is known in the art. For example, the material absorbing or shielding electromagnetic waves may have a structure which is provided with a mesh pattern including the above-described MnB-based magnetic material on a substrate. Here, the sizes of unit meshes of the mesh pattern may be the same as or different from each other, but a mesh pattern consisting of two or more unit meshes that are different in size or shape may also be used. The mesh pattern may have a line width, line spacing, and a line pitch in the range known in the art.

Still another aspect of the present application provides a semiconductor, electronic, communication, or display device including the material absorbing or shielding electromagnetic waves. The material absorbing or shielding electromagnetic waves may be applied to all devices which are required to have absorption or shielding of electromagnetic waves. For example, the material absorbing or shielding electromagnetic waves may be applied to electromagnetic wave-shielding paints, semiconductor packaging materials, wireless charging systems, electronic/communication equipment, mobile phones, display devices, etc.

DETAILED DESCRIPTION OF THE EMBODIMENTS

Hereinafter, the present invention will be described in more detail with reference to examples. However, these examples are for illustrative purposes only, and the scope of the present invention is not intended to be limited by these examples.

Example 1 (MnO+B)

5.3947 g (0.0760 mol) of MnO and 1.3701 g (0.1267 mol) of B were uniformly mixed, and molded into a cylindrical shape having a diameter of 1 cm. The molded mixture was heat-treated under an inert gas (Ar, He) atmosphere at 850° C. for 10 minutes. During this process, a spontaneous exothermic reaction occurred.

$$MnO+5/3B \rightarrow MnB+\frac{1}{3}B_2O_3$$

Figure 2:
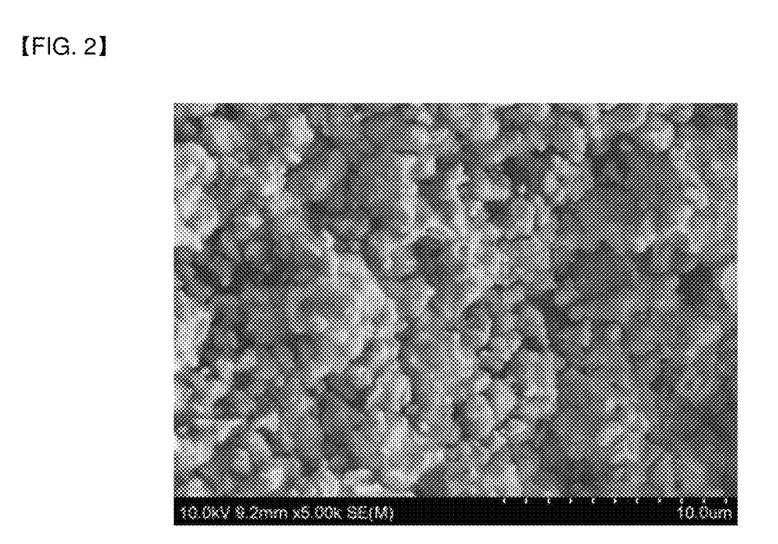
FIG. 2 shows a SEM image of MnB particles prepared in Example 1.
Figure 3:
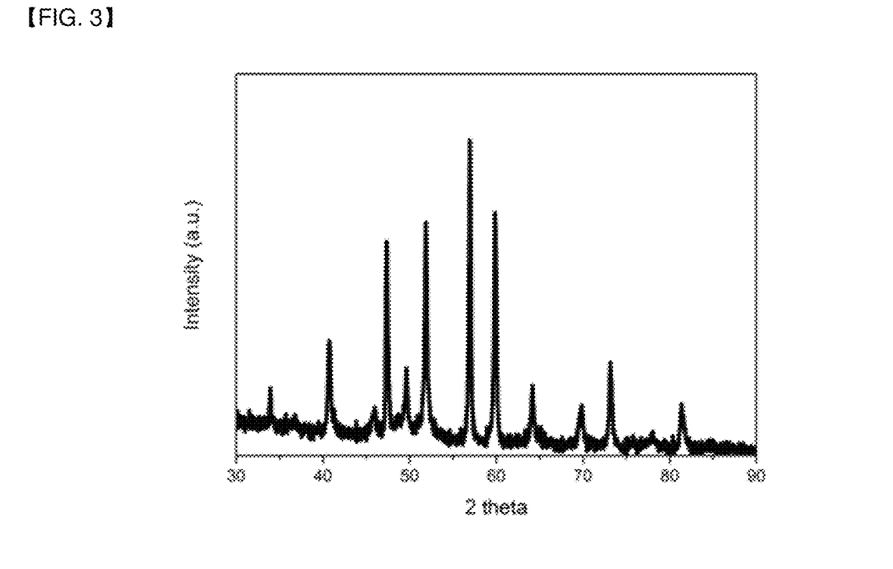
FIG. 3 shows an XRD analysis result of MnB particles prepared in Example 1.

After reaction, the reaction product cooled at room temperature was pulverized, and washed with a mixed aqueous solution of 6 wt % NaOCl and 20 wt % KOH to eliminate $B_2O_3$ which was a reaction by-product. Subsequently, MnB was washed with distilled water three times, and then with acetone once, followed by drying. A SEM image of MnB prepared in Example 1 and an XRD analysis result thereof are shown in FIGS. 2 and 3, respectively.

Example 2 (MnO+B+CaO)

5.3947 g (0.0760 mol) of MnO, 1.3701 g (0.1267 mol) of B, and 4.3176 g (0.0760 mol) of CaO were uniformly mixed, and molded into a cylindrical shape having a diameter of 1 cm. The molded mixture was heat-treated under an inert gas (Ar, He) atmosphere at 850° C. for 10 minutes. During this process, a spontaneous exothermic reaction occurred.

$$MnO+5/3B+CaO \rightarrow MnB+\frac{1}{3}Ca_3(BO_3)_2$$

Figure 4:
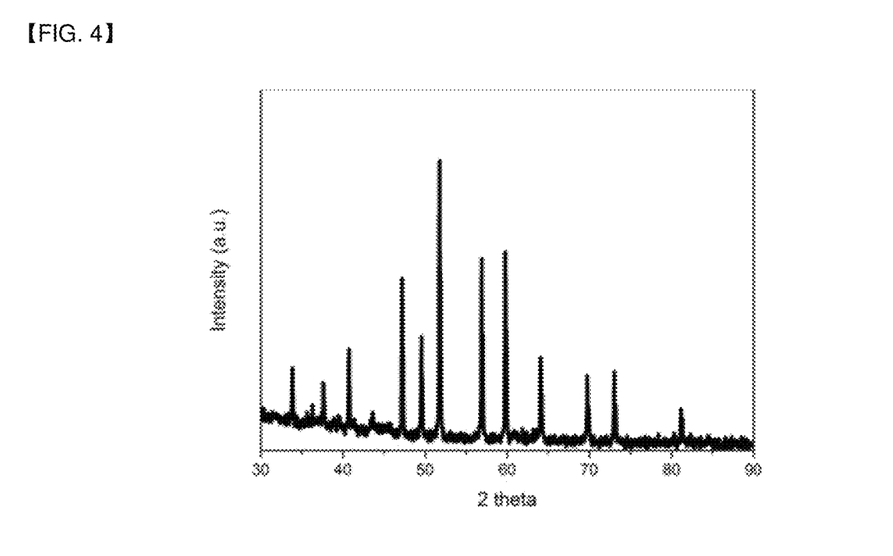
FIG. 4 shows an XRD analysis result of MnB particles prepared in Example 2.

After reaction, the reaction product cooled at room temperature was pulverized, and sequentially washed with a 20 wt % NaOH aqueous solution and a 2% acetic acid aqueous solution to eliminate $Ca_3(BO_3)_2$ which was a reaction by-product. Subsequently, MnB was washed with distilled water three times, and then with acetone once, followed by drying. An XRD analysis result of MnB prepared in Example 2 is shown in FIG. 4.

Example 3 (MnO+Nd$_2$O$_3$+B)

4.27476 g (0.06026 mol) of MnO, 1.1264 g (0.003348 mol) of $Nd_2O_3$, and 1.3534 g (0.1138 mol) of B were uniformly mixed, and molded into a cylindrical shape having a diameter of 1 cm. The molded mixture was heat-treated under an inert gas (Ar, He) atmosphere at 850° C. for 10 minutes. During this process, a spontaneous exothermic reaction occurred.

$$0.9MnO+0.05Nd_2O_3+1.7B \rightarrow Mn_{0.9}Nd_{0.1}B+0.35B_2O_3$$

After reaction, the reaction product cooled at room temperature was pulverized, and washed with a mixed aqueous solution of 6 wt % NaOCl and 20 wt % KOH to eliminate $B_2O_3$ which was a reaction by-product. Subsequently, MnB was washed with distilled water three times, and then with acetone once, followed by drying.

Comparative Example 1 (Mn+B$_2$O$_3$+Al)

8.3558 g (0.1521 mol) of Mn, 5.2946 g (0.07605 mol) of $B_2O_3$, and 4.3092 g (0.1521 mol) of Al were uniformly mixed, and molded into a cylindrical shape having a diameter of 1 cm. The molded mixture was heat-treated under an inert gas (Ar, He) atmosphere at 850° C. for 10 minutes.

$$Mn+0.5B_2O_3+Al \rightarrow MnB+0.5Al_2O_3$$

Figure 5:
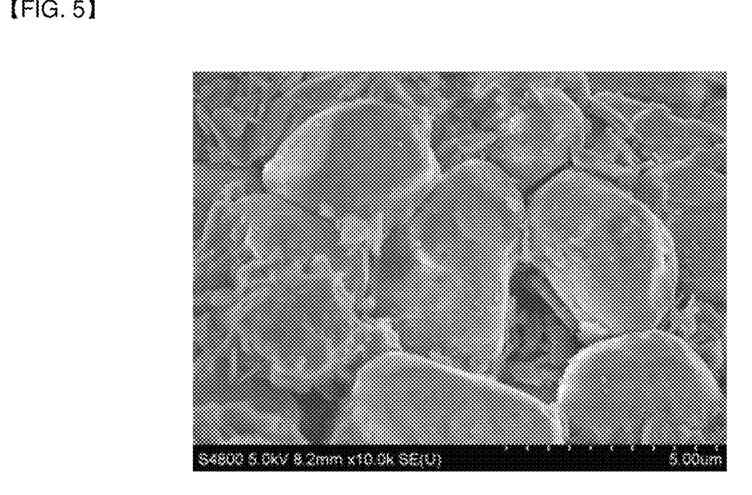
FIG. 5 shows a SEM image of MnB particles prepared in Comparative Example 1.
Figure 6:
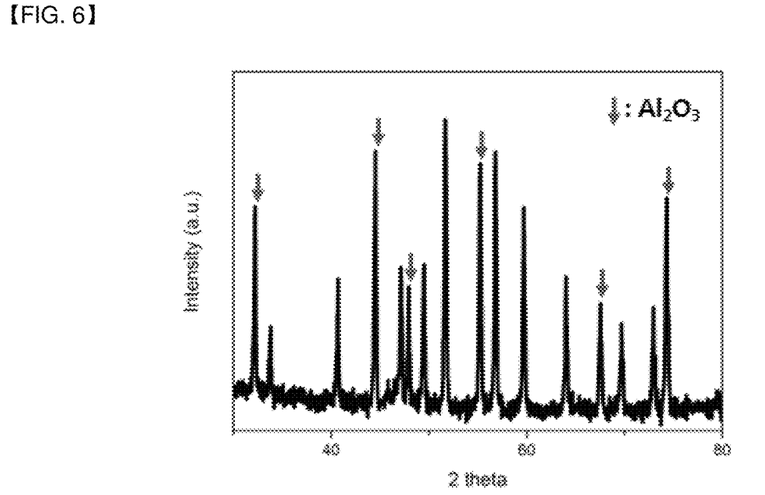
FIG. 6 shows an XRD analysis result of MnB particles prepared in Comparative Example 1.

When Mn, $B_2O_3$, and Al were used as reactants, MnB crystals were produced, but it was difficult to selectively eliminate $Al_2O_3$ which was a reaction product, and therefore, pure MnB could not be obtained. A SEM image of MnB prepared in Comparative Example 1 and an XRD analysis result thereof are shown in FIGS. 5 and 6, respectively.

Comparative Example 2 (Mn+B$_2$O$_3$+Mg)

4.1779 g (0.07605 mol) of Mn, 2.6472 g (0.0380 mol) of $B_2O_3$, and 2.7725 g (0.1141 mol) of Mg were uniformly mixed, and molded into a cylindrical shape having a diameter of 1 cm. The molded mixture was heat-treated under an inert gas (Ar, He) atmosphere at 850° C. for 10 minutes.

$$Mn+0.5B_2O_3+Mg \rightarrow MnB+1.5MgO$$

Figure 7:
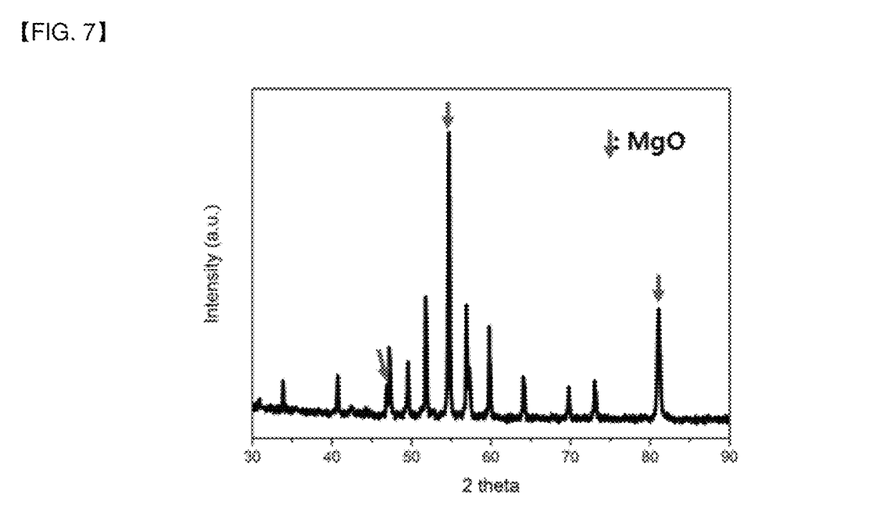
FIG. 7 shows an XRD analysis result of MnB particles prepared in Comparative Example 2.

When Mn, $B_2O_3$, and Mg were used as reactants, MnB crystals were produced, but it was difficult to selectively eliminate MgO which was a reaction product, and therefore, pure MnB could not be obtained. An XRD analysis result of MnB prepared in Comparative Example 2 is shown in FIG. 7.

Comparative Example 3 (MnO:B=1:1)

Figure 8:
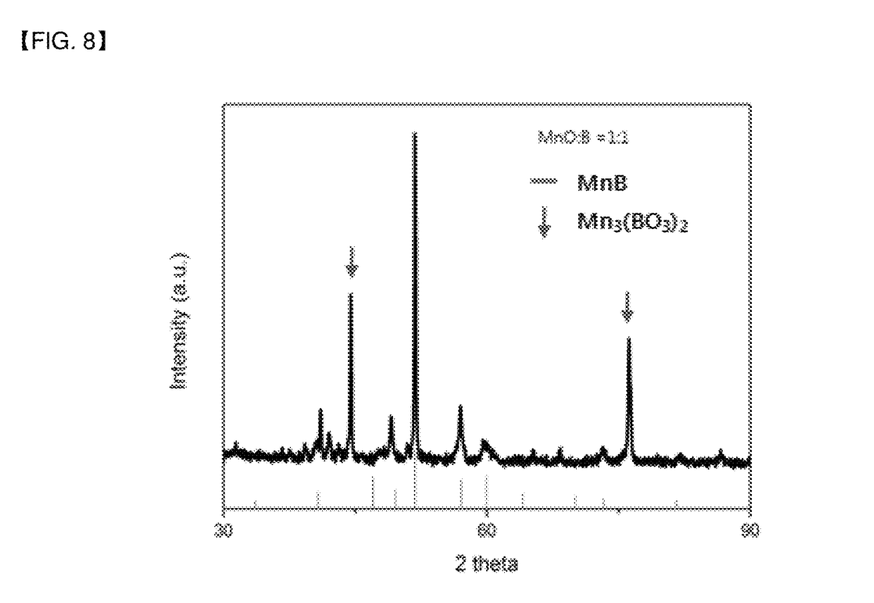
FIG. 8 shows an XRD analysis result of MnB particles prepared in Comparative Example 3.

5.3947 g (0.0760 mol) of MnO and 0.8221 g (0.0760 mol) of B were uniformly mixed, and molded into a cylindrical shape having a diameter of 1 cm. The molded mixture was heat-treated under an inert gas (Ar, He) atmosphere at 850° C. for 10 minutes. The mixture was washed with distilled water three times, then with acetone once, followed by drying, and was not washed with the mixed aqueous solution of 6 wt % NaOCl and 20 wt % KOH as in Example 1. An XRD analysis result of MnB prepared in Comparative Example 3 is shown in FIG. 8.

Comparative Example 4 (MnO:B=1:4)

5.3947 g (0.0760 mol) of MnO and 3.2886 g (0.3042 mol) of B were uniformly mixed, and molded into a cylindrical shape having a diameter of 1 cm. The molded mixture was heat-treated under an inert gas (Ar, He) atmosphere at 850° C. for 10 minutes. The mixture was washed with distilled water three times, then with acetone once, followed by drying, and was not washed with the mixed aqueous solution of 6 wt % NaOCl and 20 wt % KOH as used in Example 1.

Figure 9:
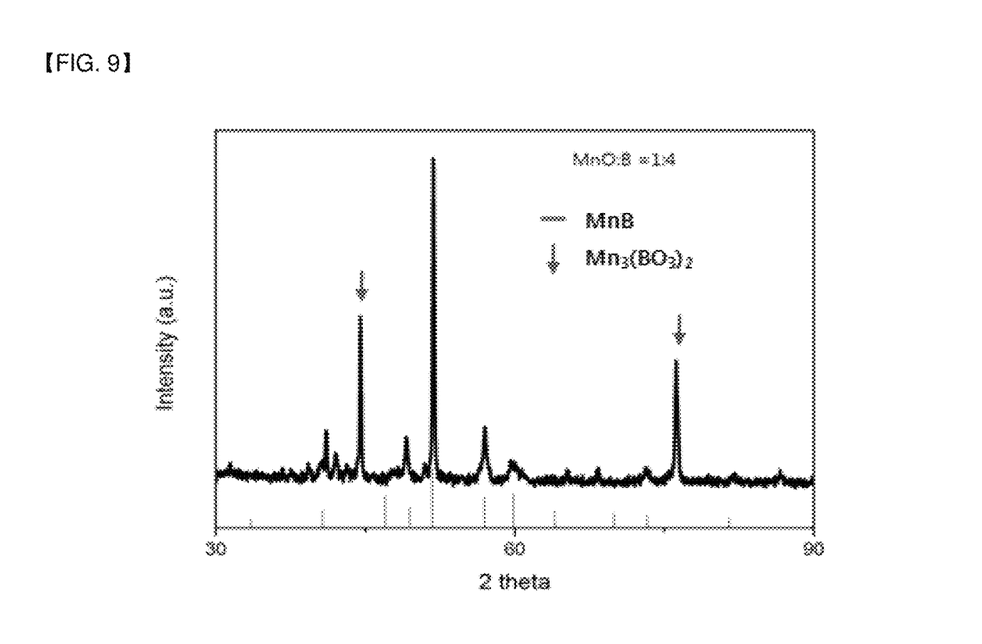
FIG. 9 shows an XRD analysis result of MnB particles prepared in Comparative Example 4.

An XRD analysis result of MnB prepared in Comparative Example 4 is shown in FIG. 9.

Figure 10:
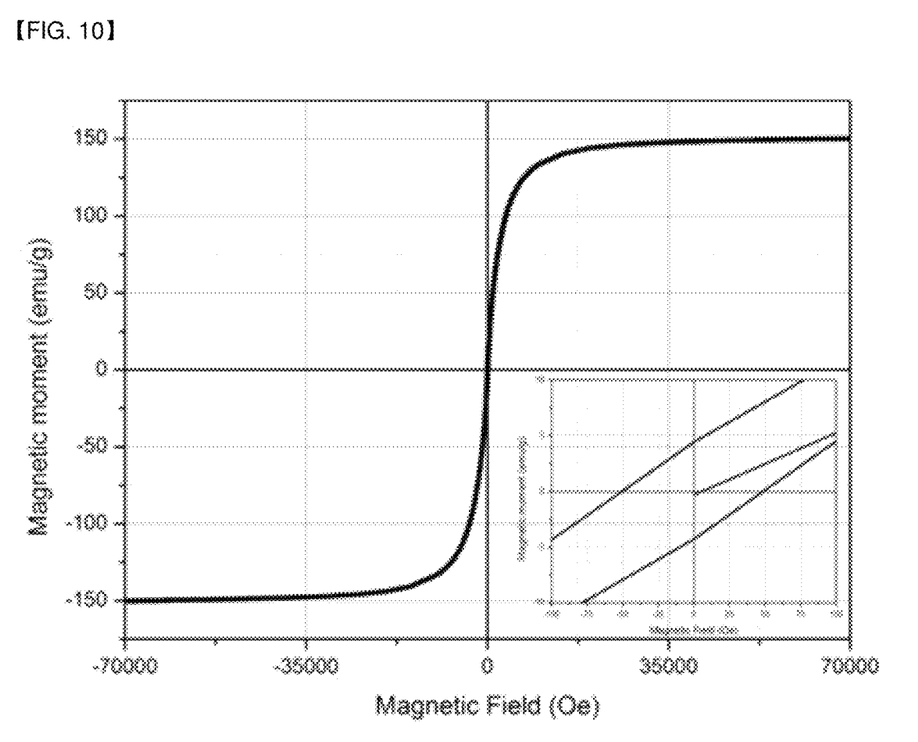
FIG. 10 shows a magnetization image of MnB particles.

A magnetization curve of MnB prepared in Example 1 is shown in FIG. 10. The MnB-based magnetic materials prepared in Examples 1 to 3 were obtained as spherical particles having a similar level of coercivity and electrical conductivity. In contrast, the materials prepared in Comparative Examples 1 and 2 showed results of remarkably low electrical conductivity while having similar coercivity, as compared with those of the examples, suggesting that $Al_2O_3$ or MgO produced as a by-product between MnB particles acts an insulator that hinders electron transport.

As in Comparative Examples 3 and 4, when reaction was allowed at an atomic ratio of Mn and B of 1:1 or 1:4, unreacted MnO or B in addition to the synthesized MnB was washed out during the washing process, and the by-product $Mn_3(BO_3)_2$ remained because it was not washed with the mixed aqueous solution of 6 wt % NaOCl and 20 wt % KOH, as confirmed in FIGS. 8 and 9.

The invention claimed is:

1. A method of preparing a MnB-based magnetic material, comprising the steps of:
    preparing a mixture including manganese oxide and boron; and
    heat-treating the mixture under an inert atmosphere.
2. The method of claim 1, wherein the mixture includes manganese oxide and boron in an amount such that an atomic ratio of boron to manganese is 5/3 to 2.
3. The method of claim 1, wherein the mixture further includes calcium oxide.
4. The method of claim 3, wherein an equivalent ratio of manganese oxide and calcium oxide in the mixture is in the range of 1:0.1 to 1:2.
5. The method of claim 1, wherein the mixture further includes a transition metal or lanthanide metal oxide.
6. The method of claim 5, wherein the transition metal or lanthanide metal oxide includes an oxide including at least one of chromium (Cr), iron (Fe), cobalt (Co), nickel (Ni), niobium (Nb), molybdenum (Mo), cerium (Ce), praseodymium (Pr), neodymium (Nd), samarium (Sm), europium (Eu), gadolinium (Gd), terbium (Tb), dysprosium (Dy), erbium (Er), and ytterbium (Yb).
7. The method of claim 6, wherein the transition metal or lanthanide metal oxide includes $Nd_2O_3$.
8. The method of claim 5, wherein an atomic ratio of manganese to the transition metal or lanthanide metal in the mixture is 8:1 to 9:1.
9. The method of claim 1, wherein a step of compressing the mixture is further performed.
10. The method of claim 1, wherein the heat treatment is performed in a range of 750° C. to 1000° C.
11. The method of claim 1, further comprising at least one of a step of cooling the reaction product, a step of pulverizing the reaction product, a step of eliminating by-products, and a step of washing the reaction product, after the heat treatment.
12. The method of claim 11, wherein the step of eliminating by-products includes a step of dissolving the by-products in a basic aqueous solution or a solution containing an organic acid.
13. A MnB-based magnetic material prepared by the preparation method of claim 1, wherein the MnB-based magnetic material is represented by the following Chemical Formula 2

Chemical Formula 2 wherein
M is a transition metal or lanthanide metal,
c, d, and e are real numbers representing an atomic ratio of Mn, M, and B,
d/(c+d) is 0.05 to 0.2, and
(c+d):e=1:0.8-1:1.2.
14. The MnB-based magnetic material of claim 13, wherein a particle size of the MnB-based magnetic material is in the range of 1 μm to 10 μm.
15. The MnB-based magnetic material of claim 13, wherein the transition metal or lanthanide metal includes at least one of chromium (Cr), iron (Fe), cobalt (Co), nickel (Ni), niobium (Nb), molybdenum (Mo), cerium (Ce), praseodymium (Pr), neodymium (Nd), samarium (Sm), europium (Eu), gadolinium (Gd), terbium (Tb), dysprosium (Dy), erbium (Er), and ytterbium (Yb).
16. The MnB-based magnetic material of claim 13, wherein the MnB-based material is in the form of a composite with a polymer or a rubber.
17. A material absorbing or shielding electromagnetic waves, comprising the MnB-based magnetic material of claim 13.
18. A semiconductor, electronic, communication, or display device, comprising the material absorbing or shielding electromagnetic waves of claim 17.

* * * * *